United States Patent [19]

Large et al.

[11] Patent Number: 4,485,475
[45] Date of Patent: Nov. 27, 1984

[54] OPTICAL SOURCE PEAK WAVELENGTH CONTROL USING A WAVELENGTH FEEDBACK NETWORK

[75] Inventors: Scott F. Large, Billerica; Bruce D. Metcalf, Burlington, both of Mass.

[73] Assignee: The Mitre Corporation, Bedford, Mass.

[21] Appl. No.: 498,659

[22] Filed: May 27, 1983

[51] Int. Cl.³ .............................................. H01S 3/10
[52] U.S. Cl. ...................................... 372/32; 372/34; 455/609
[58] Field of Search ................ 374/178; 219/501, 502; 356/45, 406, 408, 222; 370/3; 372/29, 32, 34, 36, 38; 455/44, 609; 357/19, 81

[56] References Cited

U.S. PATENT DOCUMENTS 4,319,830  3/1982  Roach ................................. 356/222
4,410,266  10/1983  Seider ................................... 356/45

OTHER PUBLICATIONS

Metcalf, B. D. et al., "High-Capacity Wavelength De-multiplexer with a Large-Diameter GRIN Rod Lens", *Applied Optics*, vol. 21, No. 5, Mar. 1, 1982.

Vanderleeden, J. C. "A Proposal for Wavelength-Tuning and Stabilization of GaAs Lasers with a Graded-Index Fibre Segment in a Dispersive Cavity" Opto-Electronics No. 6 (Nov.) 1974.

*Primary Examiner*—Joseph A. Orsino, Jr.
*Assistant Examiner*—Timothy K. Greer
*Attorney, Agent, or Firm*—Kenway & Jenney

[57] ABSTRACT

A graded index of refraction (GRIN) lens/diffraction grating combination is used to monitor the output source peak wavelength of an optical source. As the output wavelength of a source varies, different detectors are activated. The output of these detectors is used to control a thermoelectric cooler which will raise or lower the temperature of the source so as to drive the output wavelength toward the desired peak output wavelength.

6 Claims, 1 Drawing Figure

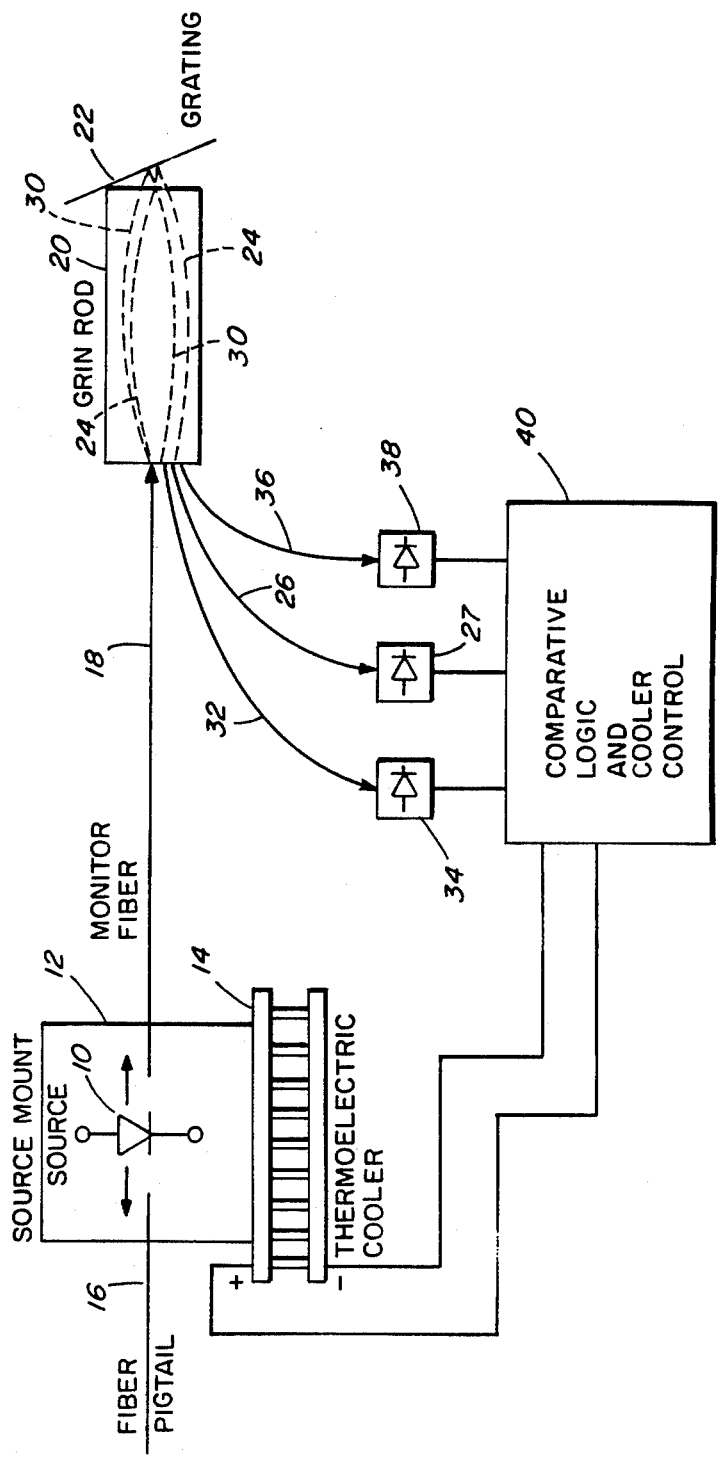

OPTICAL SOURCE PEAK WAVELENGTH CONTROL USING A WAVELENGTH FEEDBACK NETWORK

BACKGROUND OF THE INVENTION

This invention relates to optical apparatus for carrying information and, more particularly, to apparatus for controlling the wavelength of an optical source for encoding such information.

As fiber optics techniques have matured, a great deal of attention is now being paid to the wavelength division multiplexing (WDM) technique for encoding and sending information. In wavelength division multiplexing, several different optical wavelengths are multiplexed to create a single composite signal for transmission down a single optical fiber. For example, information may be impressed upon three separate wavelengths $\lambda_1$, $\lambda_2$ and $\lambda_3$. These three signals are then multiplexed to create a composite signal which can travel down a single optical fiber. At the receiving end, the composite signal is demultiplexed into the individual signals $\lambda_1$, $\lambda_2$ and $\lambda_3$ and each of these signals is demodulated to extract the impressed information. Wavelength division multiplexing offers many advantages including increased bandwidth and reliability as well as reduced size and cost. It is known that source wavelength stability is crucial in order to maintain nominal operation of such systems. In the above example, it is thus important that the source wavelengths $\lambda_1$, $\lambda_2$ and $\lambda_3$ remain stable over time. Drift of the center peak wavelengths of the input sources can cause unacceptable increases in crosstalk among the signals as well as high signal insertion losses.

It is therefore an object of this invention to provide apparatus for controlling the wavelength of optical sources used, for example, in wavelength division multiplexing.

It is a further object of this invention to provide such apparatus which employs a feedback loop to control the optical source peak wavelenth.

Yet another object of this invention is control apparatus which is highly accurate, simple and reliable in operation.

SUMMARY OF THE INVENTION

The apparatus disclosed herein for maintaining a desired output wavelength from an optical source whose output wavelength depends on the temperature of the source includes a graded index of refraction (GRIN) lens/diffraction grating combination. A monitor optical fiber is provided for introducing a portion of the output of the optical source into the GRIN lens at an input location. First, second and third output optical fibers are located at first, second and third output locations on the GRIN lens and these optical fibers are connected to first, second and third optical detectors respectively. The second output optical fiber is located between the first and third output optical fibers at a position to receive optical energy when the optical source generates the desired output wavelength. The first and third output optical fibers are located to receive optical energy only when the source generates an output wavelength which deviates from the desired wavelength. Apparatus is provided for heating or cooling the optical source in response to a signal from the first or third optical detectors so that the desired output wavelength is maintained. In a preferred embodiment the heating or cooling is accomplished with a thermoelectric device. In this embodiment the optical source is a laser diode and the detectors are light sensitive diodes. Comparative logic responsive to the first, second and third optical detectors are also provided and are adapted for controlling the heating/cooling thermoelectric device.

BRIEF DESCRIPTION OF THE DRAWING

The invention disclosed herein will be better understood with reference to the single figure of the drawing which is a schematic representation of the invention disclosed herein.

DESCRIPTION OF THE PREFERRED EMBODIMENT

Referring to the single figure of the drawing, an optical source 10 such as a conventional laser diode is mounted on a mount 12. The mount 12 is itself in thermal contact with a thermoelectric cooler 14. The laser diode 10 is adapted for producing a primary beam of light through a fiber pigtail 16. For example, it may be desired to send light having a peak wavelength $\lambda$ through the pigtail 16 for the purpose of transmitting information. A portion of the output of the laser diode 10 is fed into a monitor optical fiber 18. The monitor fiber 18 terminates at the surface of a graded index of refraction (GRIN) lens 20. The GRIN lens 20 is a device whose index of refraction varies from the center outwardly in the radial direction. A blazed diffraction grating 22 is located near the GRIN lens 20 and at an angle as shown in the figure. The combination of the GRIN lens 20 and the obliquely oriented blazed diffraction grating 22 has been described by W. J. Tomlinson in *Applied Optics,* Vol. 19, No. 7 dated Apr. 1, 1980. As will be described below, the GRIN lens/grating configuration will allow an analysis of the output spectrum of the laser diode 10.

When the output of the laser diode 10 has a desired wavelength $\lambda$, a ray 24 will propagate through the GRIN lens, encounter the blazed diffraction grating 22 and return through the GRIN lens 20 encountering an output optical fiber 26. The output optical fiber 26 terminates at a first light detector 28. The light detector 28 may be a light sensitive diode, for example. If the peak wavelength of the light from the laser diode 10 is the desired wavelength $\lambda$, substantially all of the light traveling through the monitor fiber 18 will thus impinge upon the output optical fiber 26. If, however, the peak wavelength from the laser diode 10 deviates somewhat from the desired wavelength $\lambda$, a ray will follow a different path 30 through the GRIN rod 20 and impinge on a second output optical fiber 32 after being reflected from the blazed grating 22. The output fiber 32 terminates at a second light detector 34. Thus, if the detector 34 receives light through the output optical fiber 32, it is an indication that the laser diode 10 is not operating at the desired output wavelength $\lambda$. Similarly, a third output optical fiber 36 is located on the other side of the output optical fiber 26 and terminates at a third light detector 38. If the output of the laser diode 10 deviates away from the desired wavelength $\lambda$ in the opposite direction from that illustrated by the ray 30, an additional ray (not shown for the sake of clarity) will impinge upon the third output optical fiber 36 thereby generating a signal at the third light detector 38. Thus, for example, if the output wavelength is slightly greater than the wavelength λ, the ray 30 is generated which will generate a signal at the second light detector 34. Similarly, if the output wavelength is slightly less than the desired wavelength λ, the light detector 38 will generate a signal. As will be discussed below, this arrangement will permit the very precise control of the peak wavelength from the laser diode 10.

It is known that the output wavelength of solid state lasers such as the laser diode 10 is dependent on the temperature of the laser device. For currently available semiconductor light sources, the dependance is approximately 0.3 nanometers per degree centigrade. Thus, the peak wavelength from an optical source can be adjusted by altering the temperature of the semiconductor light source such as the laser diode 10. A convenient way of altering the temperature of the laser diode 10 is to use the thermoelectric cooler 14. This conventionally known device has the property of getting colder when electrical current flows in one direction and getting hotter when the direction of current flow is reversed. With the arrangement illustrated in the figure it is a relatively simple matter to regulate the peak wavelength of the laser diode 10 by means of the thermoelectric cooler 14. The output signals from the three light detectors 28, 34 and 38 enter a logic element 40. The logic element 40 which contains conventional logic circuits (not shown) compares the outputs of the three light detectors 28, 34 and 38. If there is a non-zero signal from the light detector 28 and substantially zero signals from the light detectors 34 and 38, the logic element 40 will not energize the thermoelectric cooler 14 since a signal from the light detector 28 only indicates that the peak wavelength of light from the laser diode 10 is the desired wavelength λ. If, however, the signal from the light detector 28 diminishes and the signal from the light detector 34 takes on a non-zero value, this circumstance indicates that the peak wavelength from the laser diode 10 has shifted. In this case, the logic element 40 will cause current to flow through the thermoelectric cooler 14. The direction of current flow through the thermoelectric cooler 14 is chosen to alter the temperature of the laser diode 10 so as to diminish the signal from the light detector 34. It is clear that if a non-zero signal arises from the light detector 38, the logic element 40 will reverse the direction of current flow, again to restore the peak wavelength from the laser diode 10 to the desired wavelength λ.

The sensitivity of the feedback control just described is determined by the separation between the output optical fibers 26, 32 and 36 on the exit face of the GRIN lens. Thus, the closer the separation, the higher the sensitivity. Because the actual wavelength from the laser diode 10 is being monitored, very precise control is possible. The technique disclosed herein is thus much more accurate than simply attempting to maintain the temperature of the laser diode 10 constant.

It is thus seen that the objects of this invention have been achieved in that there has been disclosed apparatus which is capable of very accurately controlling the peak wavelength of an optical source. While the invention disclosed herein has been described with reference to its preferred embodiment, it should be understood that modifications and variations are to be included within the scope of the apended claims.

What is claimed is:

1. Apparatus for maintaining a desired output wavelength from an optical source whose output wavelength depends on the temperature of the source comprising:
   a graded index of refraction lens/diffraction grating combination;
   a monitor optical fiber for introducing a portion of the output of said source into said lens at an input location;
   first, second and third output optical fibers located at first, second and third output locations on said lens, said first, second and third output optical fibers connected to first, second and third optical detectors, respectively;
   said second output optical fiber located between said first and third output optical fibers at a position to receive optical energy when said source generates said desired output wavelength and said first and third output optical fibers located to receive optical energy when said source generates an output wavelength which deviates from said desired wavelength; and
   means for heating or cooling said optical source in response to a signal from said first or said third optical detector whereby said desired output wavelength is maintained.

2. The apparatus of claim 1 wherein said heating or cooling means is a thermoelectric device.

3. The apparatus of claim 1 wherein said optical source is a laser diode.

4. The apparatus of claim 1 wherein said detectors are light sensitive diodes.

5. The apparatus of claim 1 further including comparative logic responsive to said first, second and third optical detectors and adapted for controlling said heating/cooling means.

6. Apparatus for maintaining a desired output wavelength from a semiconductor source whose output wavelength depends on the temperature of the source comprising:
   a graded index of refraction (GRIN) lens/diffraction grating combination;
   a monitor optical fiber for introducing a portion of the output of said semiconductor source into said lens at an input location;
   first, second and third output optical fibers located at first, second and third output locations on said lens, said first, second and third output optical fibers connected to first, second and third optical light detectors respectively;
   said second output optical fiber located between said first and third output optical fibers at a position to receive optical energy when said semiconductor source generates said desired output wavelength and said first and third output optical fibers located to receive optical energy when said source generates an output wavelength which deviates from said desired wavelength; and
   means for heating or cooling said semiconductor source in response to a signal from a comparative logic means in response to a signal from said first or said third optical detectors whereby said desired output wavelength is maintained.

* * * * *